United States Patent
Doyle et al.

(10) Patent No.: US 7,422,946 B2
(45) Date of Patent: *Sep. 9, 2008

(54) INDEPENDENTLY ACCESSED DOUBLE-GATE AND TRI-GATE TRANSISTORS IN SAME PROCESS FLOW

(75) Inventors: Brian S. Doyle, Portland, OR (US); Peter L. D. Chang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/955,670

(22) Filed: Sep. 29, 2004

(65) Prior Publication Data

US 2006/0071299 A1    Apr. 6, 2006

(51) Int. Cl.
*H01L 21/336* (2006.01)

(52) U.S. Cl. .................. 438/283; 438/157; 438/164; 257/E21.442

(58) Field of Classification Search .............. None
See application file for complete search history.

(56) References Cited

U.S. PATENT DOCUMENTS

| | | | |
|---|---|---|---|
| 5,346,839 A | 9/1994 | Sundaresan | |
| 5,563,077 A | 10/1996 | Ha | |
| 5,578,513 A | 11/1996 | Maegawa | |
| 6,413,802 B1 | 7/2002 | Hu et al. | |
| 6,475,869 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,680,240 B1 | 1/2004 | Maszara | |
| 6,716,684 B1 | 4/2004 | Krivokapic et al. | |
| 6,730,964 B2 | 5/2004 | Horiuchi | |
| 6,764,884 B1 | 7/2004 | Yu et al. | |
| 6,858,478 B2 * | 2/2005 | Chau et al. ............ | 438/149 |
| 2002/0081794 A1 | 6/2002 | Ito | |
| 2002/0167007 A1 | 11/2002 | Yamazaki et al. | |
| 2003/0122186 A1 | 7/2003 | Sekigawa et al. | |

(Continued)

FOREIGN PATENT DOCUMENTS

EP    0 623 963 A1    11/1994

(Continued)

OTHER PUBLICATIONS

V. Subramanian et al., "A Bulk-Si-Compatible Ultrathin-body SOI Technology for Sub-100m MOSFETS" Proceeding of the 57th Annual Device Research Conference, pp. 28-29 (1999).

(Continued)

*Primary Examiner*—Andy Huynh
(74) *Attorney, Agent, or Firm*—Blakely, Sokoloff, Taylor & Zafman LLP

(57) ABSTRACT

A method for forming first and second devices from first and second silicon bodies is described. A sacrificial layer allows gate regions to be defined with underlying insulating members. After the sacrificial layer and bodies are surrounded in a dielectric layer, the insulative member is removed from one of the bodies. After removal of the sacrificial layer, gate structures are formed. For one device, the gate surrounds three sides of the body, and for the other device two independent gates on the sides of the body result.

13 Claims, 5 Drawing Sheets

U.S. PATENT DOCUMENTS

| | | |
|---|---|---|
| 2003/0151077 A1 | 8/2003 | Mathew et al. |
| 2004/0036118 A1 | 2/2004 | Abadeer et al. |
| 2004/0092062 A1 | 5/2004 | Ahmed et al. |
| 2004/0092067 A1 | 5/2004 | Hanafi et al. |
| 2004/0110097 A1 | 6/2004 | Ahmed et al. |
| 2004/0126975 A1 | 7/2004 | Ahmed et al. |
| 2004/0180491 A1* | 9/2004 | Arai et al. .................. 438/200 |

FOREIGN PATENT DOCUMENTS

| | | |
|---|---|---|
| WO | WO 02/43151 A | 5/2002 |
| WO | WO 2004/059726 A1 | 7/2004 |

OTHER PUBLICATIONS

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242.

International Search Report PCT/US 03/39727.

International Search Report PCT/US 03/40320.

Int'l Search Report for PCT/US2005/035380, mailing date Feb. 13, 2006, 4 pages.

Fried, David M. et al, *High-Performance P-Type Independent-Gate FinFETs*, IEEE Electron Device Letters, vol. 25, No. 4, Apr. 2004, pp. 199-201.

Fried, David M. et al, *Improved Independent Gate N-Type FinFET Fabrication and Characterization*, IEEE Electron Device Letters, vol. 24, No. 9, Sep. 2003, pp. 592-594.

Kuo, Charles et al, *A Capacitorless Double Gate DRAM Technology for Sub-100-nm Embedded and Stand-Alone Memory Application*, IEEE Trans for Electron Dev, vol. 50, No. 12, Dec. 2003, pp. 2408-2416.

Kuo, Charles et al, *A Capacitorless Double-Gate DRAM Cell Design for High Density Applications*, 2002 IEEE Int'l Electron Devices Meeting Technical Digest, Dec. 2002, pp. 843-846.

Ohsawa, Takashi et al, *Memory Design Using a One-Transistor Gain Cell on SOI*, IEEE Journal of Solid-State Circuits, vol. 37, No. 11, Nov. 2002, pp. 1510-1522.

Tanaka, T. et al, *Scalability Study on a Capacitorless IT-DRAM: From Single-gate PD-SOI to Double-gate FinDRAM*, 2004 IEEE Int'l Electron Devices Meeting Techical Digest, Dec. 2004, 4 pages.

* cited by examiner

INDEPENDENTLY ACCESSED DOUBLE-GATE AND TRI-GATE TRANSISTORS IN SAME PROCESS FLOW

FIELD OF THE INVENTION

The invention relates to the field of semiconductor processing.

PRIOR ART AND RELATED ART

One relatively recent development in semiconductor processing is the independently-controlled double-gate (I-gate) transistor. This transistor has two gates disposed on opposite sides of a channel, each gate being independently controlled. Independent gate control provides some unique transistor characteristics and enables, for example, a single body, dynamic random-access memory (DRAM) cell.

Another relatively recent development in semiconductor processing is the tri-gate transistor. Here, a gate is formed on three sides of a channel region. This transistor, particularly when used with a high-k insulator and metal gate, provides substantial performance improvements.

Several I-gate structures have been proposed. This and other related technology is described at C. Kuo, *IEDM*, Dec. 2002, following M. Chan *Electron Device Letters*, Jan. 1994; C. Kuo, *IEDM*, Dec. 2002, "*A Hypothetical Construction of the Double Gate Floating Body Cell;*" T. Ohsawa, et al., *IEEE Journal of Solid-State Circuits*, Vol. 37, No. 11, Nov. 2002; David M. Fried, et al., "*High-Performance P-Type Independent-Gate FinFETs,*" IEEE Electron Device Letters, Vol. 25, No. 4, Apr. 2004; and David M. Fried, et al., "*Improved Independent Gate N-Type FinFET Fabrication and Characterization,*" IEEE Electron Device Letters, Vol. 24, No. 9, Sep. 2003.

Tri-gate structures are described at, for instance, publication number U.S. 2004-0036127-A1.

DETAILED DESCRIPTION

Figure 1A:
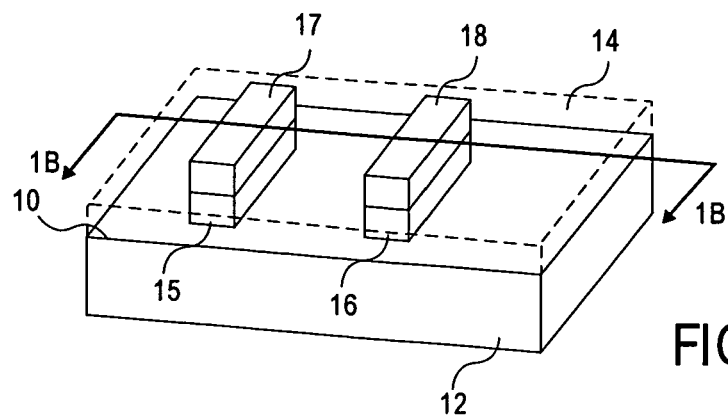
FIG. 1A is a perspective view of a substrate which includes two silicon bodies with overlying insulative members

In the following description, the fabricating of an independently accessed, double-gate (I-gate) transistor and a tri-gate transistor on a common substrate is described. Numerous specific details are set forth, such as specific materials, in order to provide a thorough understanding of the present invention. It will be apparent to one skilled in the art, that the present invention may be practiced without these specific details. In other instances, well known processing steps have not been described in detail, in order not to unnecessarily obscure the present invention. For example, well-known cleaning steps, and some protective layers often used in the fabrication of integrated circuits, are not described.

The method which follows describes the formation of both the I-gate transistor and a tri-gate transistor in a single process flow. While the fabrication of only a single I-gate transistor and a single tri-gate transistor are illustrated, it will be apparent to one skilled in the art, that in a typical integrated circuit, numerous such transistors are simultaneously fabricated. Moreover, the I-gate and tri-gate transistors may be fabricated wherever needed in the integrated circuit. Thus, a single circuit, such as a buffer, may have both I-gate and tri-gate transistors. In some cases, for example in a DRAM, an array of memory cells using only I-gate transistors may be fabricated and connected to peripheral circuits which use both I-gate and tri-gate transistors. A memory using I-gate memory cells is described in "Memory with Split-Gate Devices and Method of Fabrication," Ser. No. 10/816,282, filed Mar. 31, 2004, and assigned to the assignee of the present application.

In one embodiment, the transistors are fabricated on an oxide layer 10 which is formed on a silicon substrate 12. The transistor bodies are fabricated from a monocrystalline silicon layer 14 (shown in dotted lines in FIGS. 1A and 1B) disposed on layer 10. This silicon-on-insulator (SOI) substrate is well-known in the semiconductor industry, where as shown, the layer 14 is disposed on the layer 10. By way of example, the SOI substrate is fabricated by bonding the oxide layer 10 and a silicon layer 14 onto the substrate 12, and then, planarizing the layer 14 so that it is relatively thin. This relatively thin, low body effect layer, is used to form the bodies of active devices, as mentioned. Other techniques are known for forming an SOI substrate including, for instance, the implantation of oxygen into a silicon substrate to form a buried oxide layer. In the subsequent cross-sectional views, the transistors are shown fabricated on the oxide layer 10, the underlying silicon substrate 12 is not shown.

The layer 14 may be selectively ion-implanted with an n-type dopant in the regions where n channel devices are to be fabricated, and with a p type dopant in those regions where p channel devices are to be fabricated. This is used to provide the relatively light doping typically found in the channel regions of MOS devices fabricated in a CMOS integrated circuit. Both the I-gate and tri-gate transistors may be fabricated with the described process as either p channel or n channel devices. (The doping of the channel regions of the transistors may be done at other points in the process flow such as the point in the process shown in FIG. 1A or 7A.)

In the processing for one embodiment, a protective oxide (not shown) is disposed on the silicon layer 14 followed by the deposition of a silicon nitride layer. The nitride layer is masked to define a plurality of insulative members, such as members 17 and 18 of FIGS. 1A and 1B. Then, the underlying silicon layer 14 is etched in alignment with these members resulting in the silicon bodies 15 and 16.

The width of the silicon bodies 15 and 16 may be the critical dimension in a particular process, for instance, in a 30 nanometer (nm) gate length process, these bodies may have a width of 30 nm. The thickness of the layer 14, and the silicon nitride layer from which the members 17 and 18 are formed, may each be, by way of example, in the range of 10-50 nm.

Figure 1B:
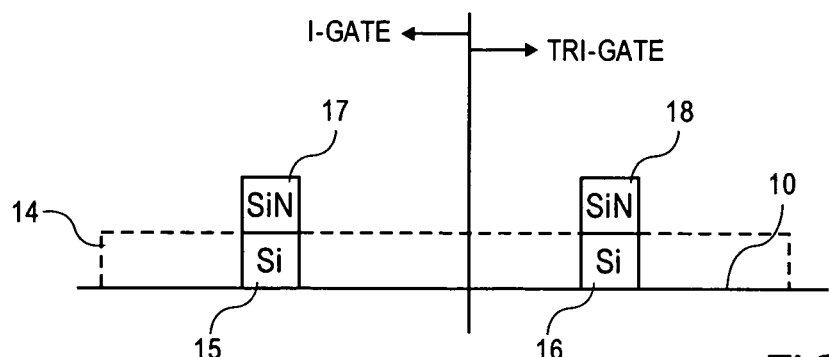
FIG. 1B is a cross-sectional, elevation view of the structure of FIG. 1 taken through section line 1B-1B of FIG. 1A.

Now, a sacrificial layer is deposited over the structure of FIG. 1A on the oxide layer 10. In one embodiment, this layer is a polysilicon layer 50-100 nm thick. Other materials may be used for the sacrificial layer. The material for the sacrificial layer should be able to protect the channel regions of the devices from ion implantation during the formation of the source and drain regions, as will be described. Moreover, the sacrificial layer should be able to be etched without destroying the integrity of an ILD formed around the sacrificial layer after patterning, as will be described. Additionally, the insulative members must be able to be selectively etched in the presence of the sacrificial layer.

Figure 2A:
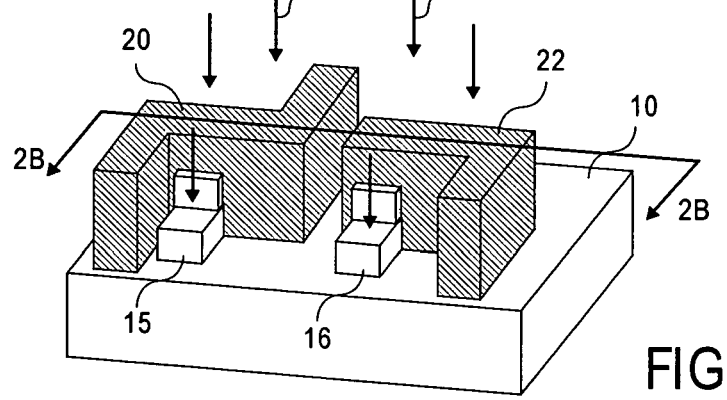
FIG. 2A illustrates the structure of FIG. 1 following the patterning of a sacrificial layer.
Figure 2B:
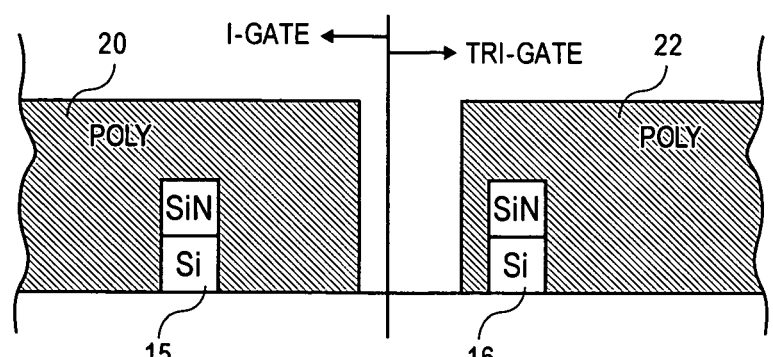
FIG. 2B is a cross-sectional, elevation view of the structure of FIG. 2A taken through section line 2B-2B of FIG. 2A.

Next, the sacrificial layer is patterned into gate-defining members shown as members 20 and 22 in FIG. 2A. The member 20 occupies the region in which the two gates for the I-gate transistor is fabricated as well as "fins" for these gates to allow contact with the gates as shown later. The member 22 occupies the region in which the tri-gate is formed for the tri-gate transistor, as well as a fin, again for contact.

At this point in the processing, the silicon nitride members 17 and 18 may be etched in alignment with the member 20 and 22, thereby exposing portions of the underlying silicon bodies 15 and 16. As shown by the arrows 25, the silicon bodies, to the extent they are not covered by the members 20 and 22, are ion implanted to form source and drain regions for both the I-gate and tri-gate transistors. As is commonly done, but not shown, separate ion implantation steps are used for the p channel and n channel devices, with protective layers being used to permit separate implantation of the source and drains for the p channel and n channel devices.

Alternatively, the silicon nitride members 17 and 18 may remain in place, and the source and drain regions implanted at an angle, so that the dopant enters the sides of the silicon bodies 15 and 16.

Additionally, spacers may be formed to allow a more lightly doped source and drain region to be implanted adjacent the channel region, and more heavily doped source and drain regions spaced apart from the channel region. This is described in the above-referenced application Ser. No. 10/816,282.

Figure 3:
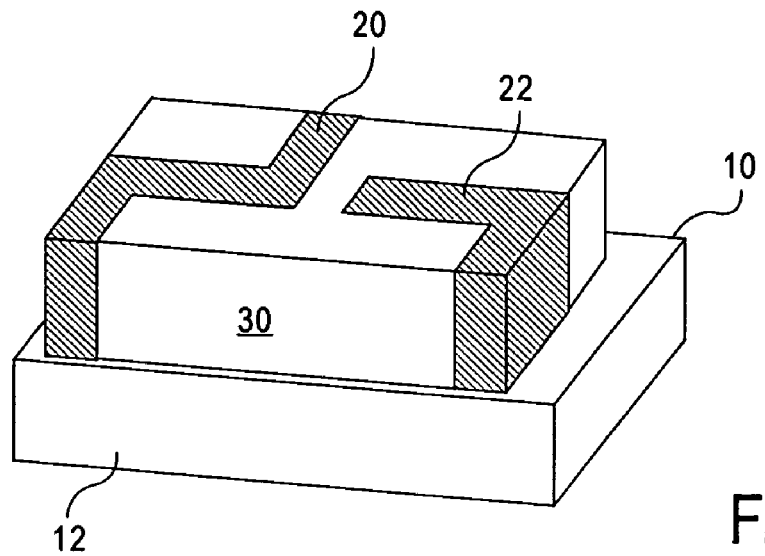
FIG. 3 is a perspective view of the structure of FIG. 2A following the deposition of an interlayer dielectric (ILD).

An ILD 30 is now formed on the insulative layer 10 as shown in FIG. 3. The ILD 30 surrounds the members 20 and 22, and as will be seen, allows the inlay of metal once the polysilicon is removed. The ILD 30 may be, for instance, a chemical vapor deposited (CVD) silicon dioxide layer.

The structure of FIG. 3 is now planarized, for instance, if a chemical mechanical polishing (CMP) process, so as to expose the silicon nitride insulative members 17 and 18. This is illustrated in both FIGS. 4A and 4B. Note, the members 17 and 18 are flush with the upper surface of the ILD 30, as are the members 20 and 22.

Figure 4A:
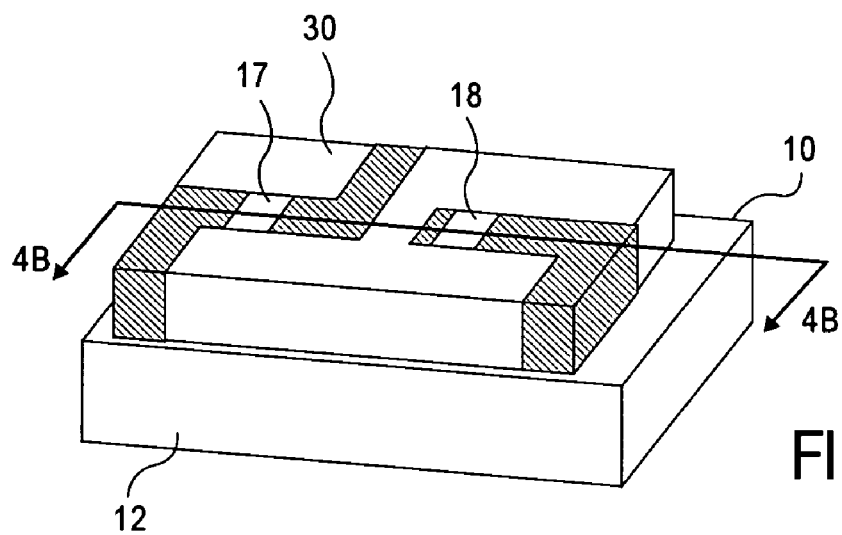
FIG. 4A is a perspective view of the structure of FIG. 3 following planarization.
Figure 4B:
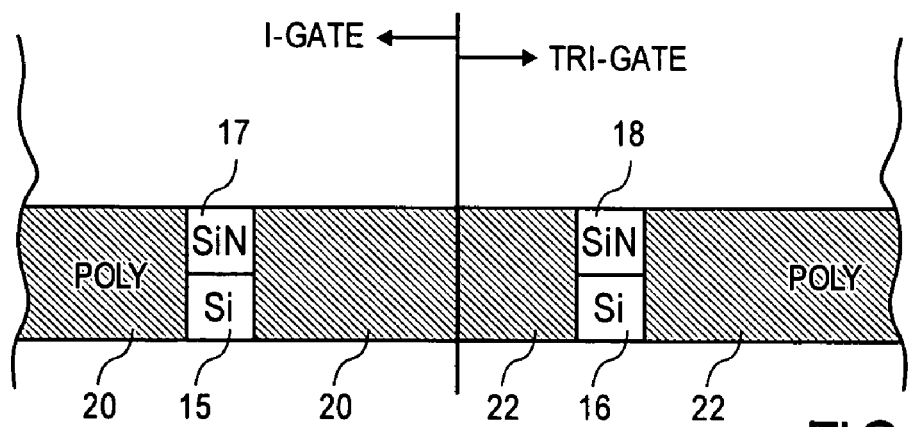
FIG. 4B is a cross-sectional, elevation view taken through section line 4B-4B of FIG. 4A.
Figure 5:
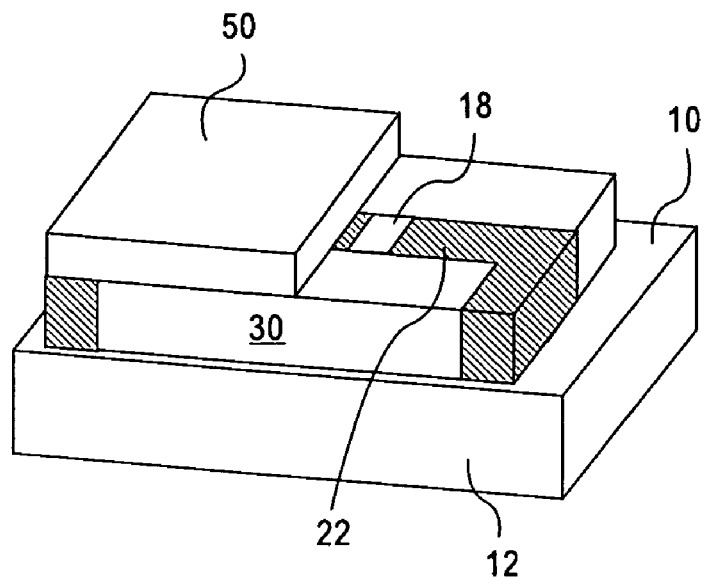
FIG. 5 is a perspective view of the structure of FIG. 4 following the covering of a section of the substrate on which an I-gate transistor is fabricated.

Now, a photoresist layer is deposited over the structure of FIGS. 4A and 4B, and patterned so as to remain in place over the I-gate transistor region. The photoresist layer 50 covers the insulative member 17. As shown in FIG. 5, the photoresist layer 50 leaves exposed insulative member 18 of the tri-gate device.

Figure 6A:
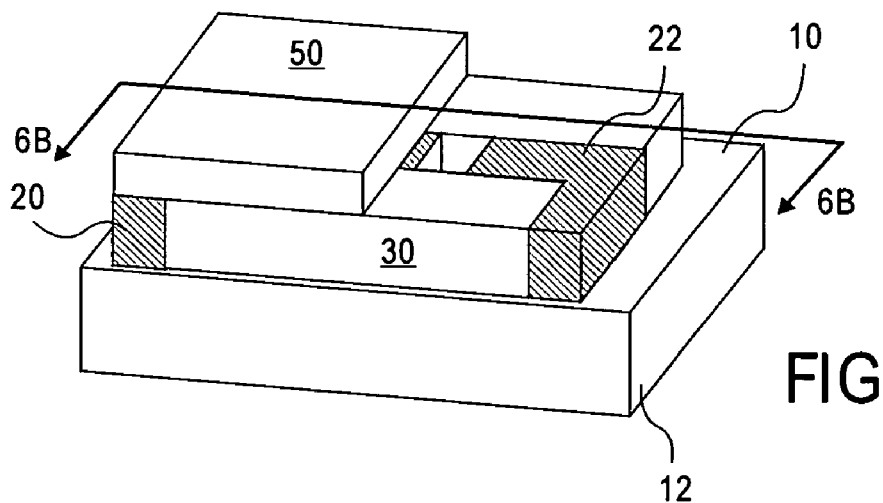
FIG. 6A is a perspective view of the structure of FIG. 5 following an etching step.
Figure 6B:
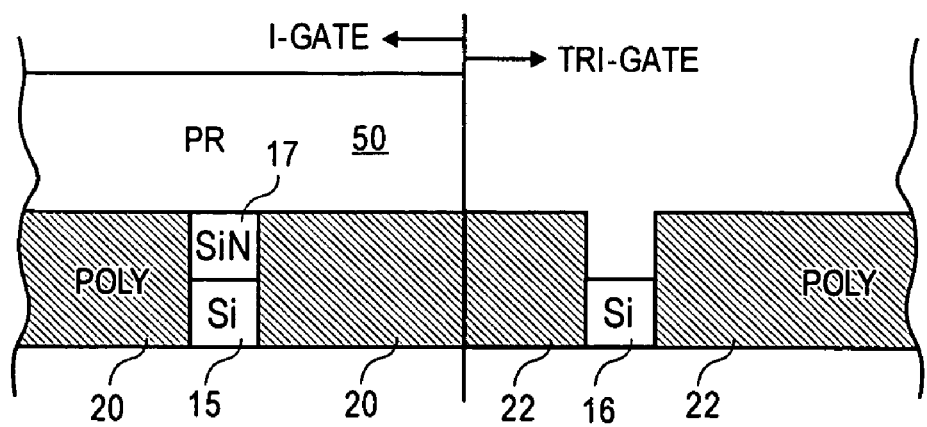
FIG. 6B is a cross-sectional view of the structure of FIG. 6A taken through section line 6B-6B of FIG. 6A.

Then, as shown in FIGS. 6A and 6B, an etching process is used to remove the plug-shaped silicon nitride member 18. An etchant that discriminates between the silicon nitride and both the ILD 30 and sacrificial layer is used so that the ILD 30 and member 22 remains substantially intact. A dry or wet etchant may be used. Once the member 18 is removed, the underlying silicon body 16 as shown in FIG. 6B is exposed.

Figure 7A:
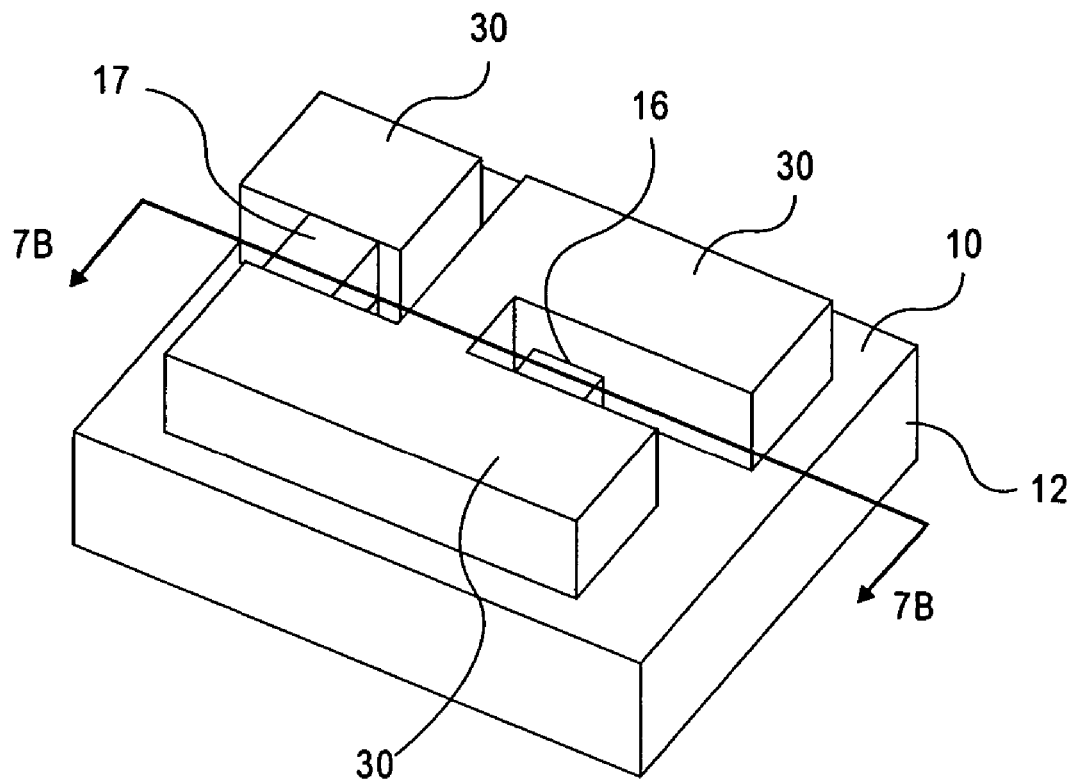
FIG 7A is a perspective view of the structure of FIG. 6A following removal of the patterned, sacrificial layer.
Figure 7B:
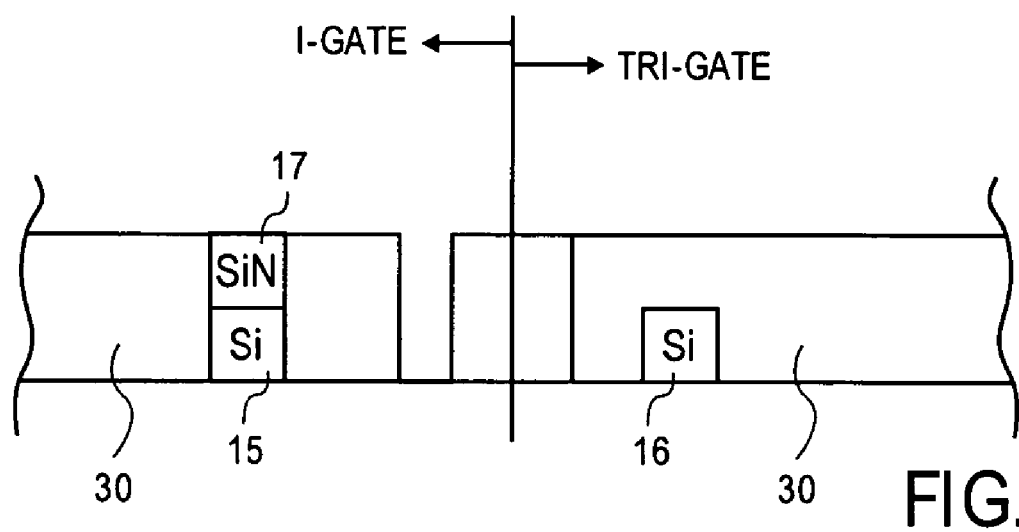
FIG. 7B is a cross-sectional, elevation view of the structure of FIG. 7A taken through section in 7B-7B of FIG. 7A.

The polysilicon sacrificial layer is next removed with, for example, a wet etch process. The resultant structure is shown in FIGS. 7A and 7B. The remaining ILD 30 now defines a form in which the gates for the transistors may be fabricated.

Figure 8:
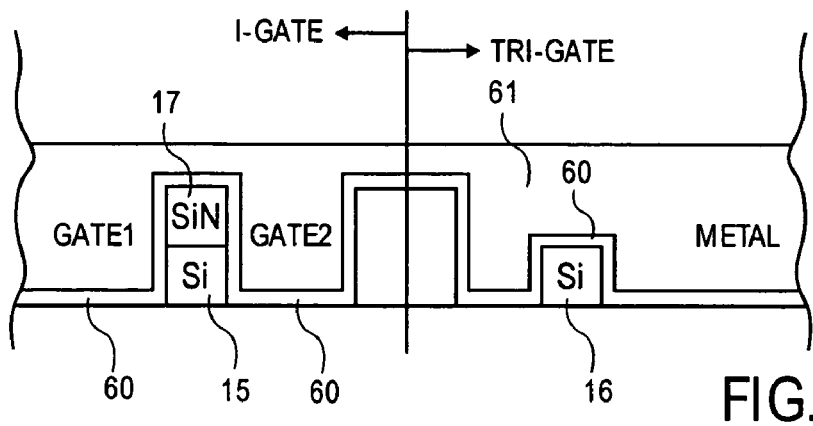
FIG. 8 is a cross-sectional, elevation view of the structure of FIGS. 7A and 7B following the formation of an insulative layer and a metal layer.

A gate dielectric layer 60 is formed on and around each semiconductor bodies 15 and 16 as seen in FIG. 8. Specifically, a gate dielectric may be deposited such that it covers the top surface of the semiconductor body 16 and the insulative member 17 as well as on the opposite side-walls of each of the semiconductor bodies. This gate dielectric, ideally has a high dielectric constant, such as a metal oxide dielectric, for instance, $HfO_2$ or ZrO or other high-k dielectrics, such as PZT or BST. A high-k dielectric film can be formed by any well-known technique such as by chemical vapor deposition (CVD). Alternatively, the gate dielectric can be a grown dielectric. In one embodiment, the gate dielectric layer 60 is a silicon dioxide film grown with a dry/wet oxidation process. For example, the silicon dioxide film is grown to a thickness of between 5-50 Å. (A conformally deposited dielectric layer is shown in FIG. 8.)

Next, as shown in FIG. 8, a gate electrode (metal) layer 61 is formed over the gate dielectric layer 60. The gate electrode layer 61 may be formed by blanket deposition of a suitable gate electrode material. In one embodiment, a gate electrode material comprises a metal film such as Tungsten, Tantalum, Titanium and/or nitrides and alloys thereof. For the n channel, I-gate and tri-gate transistors, a work function in the range of 4.0 to 4.6 eV may be used. For the p channel, I-gate and tri-gate transistors, a work function of 4.6 to 5.2 eV may be used. Consequently, for substrates with both n channel and p channel transistors, two separate metal deposition processes may need to be used.

Figure 9A:
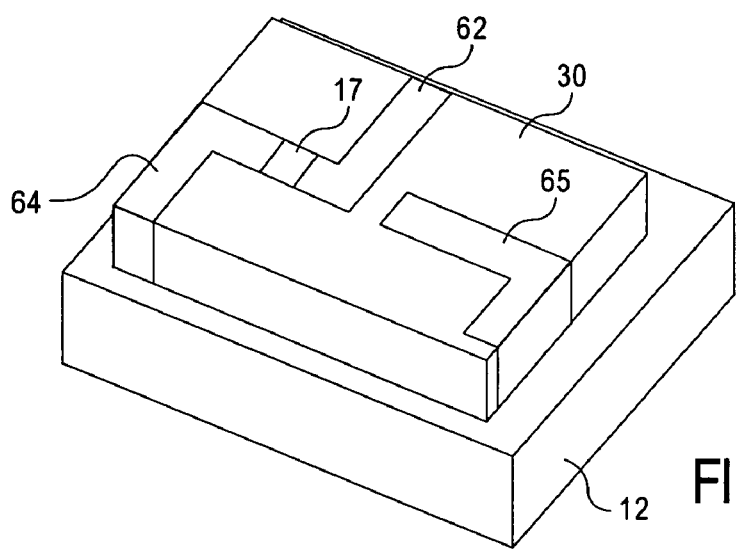
FIG. 9A is a perspective view of the structure of FIG. 8 following planarization of the metal layer.

The metal layer 61 is planarized using, for example CMP, and such planarization continues until at least the upper surface of the insulative member 17 is exposed, as shown in FIG. 9A. This is done in order to assure that no metal spans the member 17, since otherwise, the gates in the I-gate transistor will be shorted together. As can be seen in FIG. 9, there are two independent gates 62 and 64 for the I-gate transistor, and a single gate 65 for the tri-gate device.

Figure 9B:
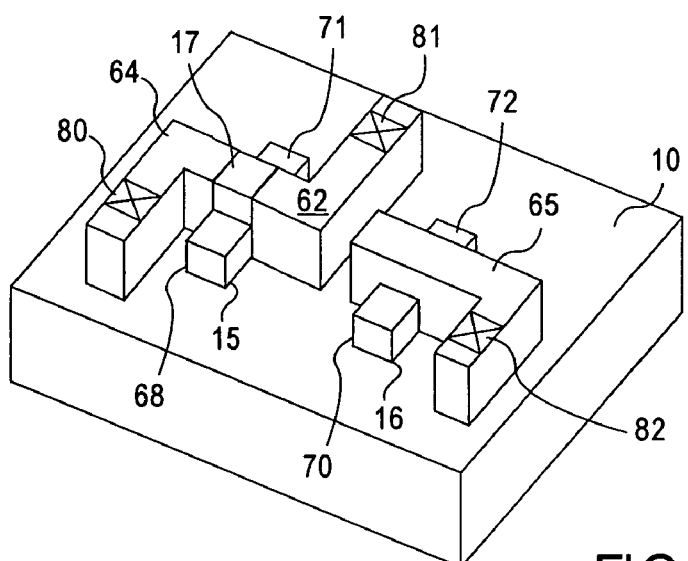
FIG. 9B is a perspective view of the structure of FIG. 9A with the ILD removed.

The gate 65 for the tri-gate transistor has a top surface opposite the bottom surface and has a pair of laterally opposite sidewalls formed adjacent the tri-gate structure best seen in FIG. 9B. These sidewalls are connected on the upper surface of the silicon body. Thus, the gate surrounds the channel region of the tri-gate transistor on three sides. For the I-gate transistor, two independent gates 62 and 64 are separated by the insulative member 17, again best seen in FIG. 9B where the ILD is shown removed.

Also, best seen in FIG. 9B, the silicon bodies 15 and 16 are shown on the insulative layer 10. Source regions 68 and 70 are shown for each of the transistors along with drain regions 71 and 72. The independent gates 62 and 64 along with their orthogonally disposed fins are readily seen. The same is true for the gate 65. These fins allow for easier contact to be made to the gates from overlying metalization layer, as shown by contact regions 80, 81 and 82. While not shown in FIG. 9B, contact is made to the source and drain regions as well as to the gates from overlying metalization layers through contacts not shown.

I-gate transistors may be used in logic circuits along with the tri-gate transistors. I-gate transistors have characteristics which make them desirable in certain circuits. For instance, a single I-gate transistor may provide both a high current and medium current device depending on the potential applied to one or both gates. Such devices may provide a "strong off" device to reduce leakage in a sleep mode or power-down mode. I-gate transistors also provide a device for pre-charge lines by allowing a trickle current. In the above-mentioned patent application, the I-gate devices are used as DRAM cells, and the process described above, may be used in connection with such DRAM fabrication. In this case, the silicon body 15 is an elongated body formed in a plurality of parallel, spaced-apart lines and used in an array of DRAM cells.

While in the figures two separate silicon bodies are shown, it will be appreciated that a single body may be used. Then, a tri-gate and I-gate transistor may be fabricated in series with one another In this case, the series transistors have a source/drain region.

Thus, a process has been described and a resultant structure for an integrated circuit having both an I-gate and tri-gate structure on a common substrate.

What is claimed is:

1. A method comprising:
    forming at least two silicon bodies having overlying insulating members;
    forming a sacrificial layer around the two silicon bodies and the overlying insulating members;
    patterning the sacrificial layer defining gate regions, intersecting the silicon bodies;
    enclosing the patterned sacrificial layer and the silicon bodies with the overlying insulating members in a dielectric layer such that the insulating members are exposed above the gate regions;
    covering one of the insulating members to protect it from being etched;
    etching the other of the insulating members while the first insulating member is covered;
    removing the patterned sacrificial layer leaving in place the dielectric layer; and
    forming a gate insulating layer and metal gate layer within the gate regions.

2. The method of claim 1, including planarizing the dielectric layer to expose the insulating members.

3. The method defined by claim 2, wherein the silicon bodies comprise a monocrystalline silicon.

4. The method defined by claim 3, wherein the insulating members comprise silicon nitride.

5. The method defined by claim 4, wherein the sacrificial layer comprises polysilicon.

6. The method defined by claim 5, wherein the planarizing comprises chemical-mechanical polishing.

7. The method defined by claim 1, including removing the insulating members to the extent that they are exposed following the patterning of the sacrificial layer.

8. The method defined by claim 7, including doping source and drain regions in the silicon bodies after the patterning of the sacrificial layer.

9. The method defined by claim 1, wherein the removal of the other of the insulating members is done with an etchant that has a higher etch rate for the insulating member than the etch rate for the dielectric layer.

10. A method comprising:
    etching a first and a second silicon body with a first and a second insulating member, respectively;
    removing portions of the insulating members to define source and drain regions;
    doping the source and drain regions;
    surrounding the silicon bodies in an insulating layer such that upper surfaces of the insulating members are exposed;
    removing the second insulating member while leaving in place the first insulating member;
    forming a first gate structure on opposite sides of the first silicon body, the first gate structure having two independent gates separated by the first insulating member; and
    forming a second gate structure on three sides of the second silicon body.

11. The method defined by claim 10, wherein the first and second gate structures are metal, insulated from their respective silicon bodies by high-k insulation.

12. The method defined by claim 11, including forming and patterning a sacrificial layer to define the first and second insulating members and wherein the gate structures are formed by removal of a sacrificial layer surrounding the insulating layer.

13. The method defined by claim 12, wherein the sacrificial layer comprises polysilicon and the insulating members comprise silicon nitride.

* * * * *

UNITED STATES PATENT AND TRADEMARK OFFICE
CERTIFICATE OF CORRECTION

PATENT NO. : 7,422,946 B2 Page 1 of 1
APPLICATION NO. : 10/955670
DATED : September 9, 2008
INVENTOR(S) : Doyle et al.

It is certified that error appears in the above-identified patent and that said Letters Patent is hereby corrected as shown below:

In column 3, at line 16, delete "run" and insert --nm--.

Signed and Sealed this

Second Day of December, 2008

JON W. DUDAS
*Director of the United States Patent and Trademark Office*